United States Patent [19]
Horner

[11] 4,081,815
[45] Mar. 28, 1978

[54] APPARATUS FOR GUIDING SHEET MATERIAL INTO COUNTERROTATING BRUSHES

[75] Inventor: Ellwood J. Horner, Armonk, N.Y.

[73] Assignee: American Hoechst Corporation, Bridgewater, N.J.

[21] Appl. No.: 427,672

[22] Filed: Dec. 26, 1973

Related U.S. Application Data

[63] Continuation-in-part of Ser. No. 215,533, Jan. 5, 1972, abandoned, and Ser. No. 349,737, Apr. 10, 1973, Pat. No. 3,809,105.

[51] Int. Cl.² ............................................. G03D 3/08
[52] U.S. Cl. ...................................... 354/319; 15/77; 354/339
[58] Field of Search .................................. 15/77, 102; 118/DIG. 23; 354/297, 317, 318, 319, 325, 328, 337, 339

[56] References Cited

U.S. PATENT DOCUMENTS

| | | | |
|---|---|---|---|
| 2,181,266 | 11/1939 | Durup | 15/77 |
| 2,380,550 | 7/1945 | Reed | 15/77 X |
| 2,677,320 | 5/1954 | Coughlin | 354/297 |
| 3,568,587 | 3/1971 | Laval | 354/297 X |
| 3,682,078 | 8/1972 | Parker et al. | 354/317 |
| 3,707,328 | 12/1972 | Robertson | 354/339 X |
| 3,732,808 | 5/1973 | Graham | 18/DIG. 23 X |

FOREIGN PATENT DOCUMENTS 326,568   3/1930   United Kingdom ................. 354/318

Primary Examiner—Fred L. Braun
Attorney, Agent, or Firm—James E. Bryan

[57] ABSTRACT

Apparatus for treating sheet material in which the sheet material is transported into at least one revolving brush rotating in a direction opposite to the direction of travel of the sheet material, particularly a lithographic plate processor in which a developer solution is applied to at least one side of the plate and the brushes remove unwanted coating from the surface of the plate, in which a guide plate having a length substantially equal to the width of the sheet material is mounted immediately in front of the brush, with respect to the direction of travel of the sheet material and adjacent the surface of the sheet material, and extends into the nip of the brush to a point just behind a plane through the axis of rotation of the brush. Where both sides of the sheet are to be treated, the pair of brushes is mounted on opposite sides of the sheet, a pair of guide plates are mounted on opposite sides of the sheet, the guide plates are generally-flat plates forming a soaking chamber and developer solution conduits are provided for flooding the soaking chamber with treating solution.

6 Claims, 3 Drawing Figures

APPARATUS FOR GUIDING SHEET MATERIAL INTO COUNTERROTATING BRUSHES

The present invention is a continuation-in-part of application Ser. No. 215,533, filed Jan. 5, 1972, now abandoned, and application Ser. No. 349,737, filed Apr. 10, 1973, now U.S. Pat. No. 3,809,105, both by the present inventor.

The present invention relates to an apparatus for guiding thin, unsupported sheet material (such as metal foils) into a revolving brush or brushes for cleaning or processing the sheet material. By using the apparatus of the present invention, such cleaning or processing can be accomplished on either one or both sides of the sheet material by the revolving brushes without permitting it to be curled or damaged by the action of the brushes, which rotate in a direction opposite to the direction of travel of the sheet material, and while simultaneously attaining complete and effective treatment. If cleaning or processing fluids are utilized, they can be introduced before or after the sheet material comes into contact with the brush or brushes. The guiding apparatus of the present invention can be made of either metals or smooth, rigid plastics which will not scratch the surface of the sheet material.

In numerous techniques for treating sheet materials, it is highly desirable to utilize a brush or brushes which rotate in a direction opposite to the direction of travel of the sheet material. Not only does this subject the sheet material to the additive action of the relative surface speeds of the sheet material and the rotating brush or brushes, but, where removal of unwanted coatings is desired, such removal of material is more effective than when the brush or brushes are rotating in the same direction as the direction of travel of the sheet and removed material is prevented from traveling with the sheet, thus keeping the sheet cleaner by preventing redeposit. Such counterrotating brushes are described in applications Ser. Nos. 215,533 and 349,737 noted hereinabove.

However, a thin, semiflexible sheet of material traveling in a direction opposite to the direction of a revolving brush or brushes is forced to change direction, and, if the forces acting on the material are greater than the strength of the material, it will take a set curl or be physically damaged by being thrown into other parts of the mechanism by the repulsive action of the brushes. Consequently, to avoid these problems, numerous means have been employed by the prior art, such as, permitting the leading edge of a sheet of material to pass a brush or brushes before rotation of the brush is started, rotating the brush or brushes in the same direction as the direction of travel of the sheet material until the leading edge is beyond the contact action of the brush or brushes and then reversing the brushes (Cuthbert, U.S. Pat. No. 3,552,293) or using some form of rigid clamping means on the leading edge of the material to overcome the forces of the brush or brushes.

An example of a rigid clamping mechanism to prevent damage to the sheet while using the desirable counterrotating brushes is offered by the 3M (Minnesota Mining and Manufacturing Co.) Model 440 negative-working plate developing machine. In this machine, all action takes place on the surface of a large drum. An exposed printing plate is fed into a complicated gripper spring mechanism, initially open, which is cam controlled so that after the drum has revolved a few degrees of its arc, the gripper closes and secures the plate. Part way during the revolution of the drum, the plate is sprayed with developer, following which it is subjected to the action of the counterrotating brushes. At the end of one revolution, the plate is released when the cam now forces the gripper spring open. This mechanism has the following disadvantages:

1. In this machine, the brushing action is limited to one side only of the sheet material.
2. The gripper spring and cam action are complicated and subject to malfunction.
3. The plate must be fed into a slot in the drum face and down onto a support bracket which can and often does scratch the plate surface.

In using the prior art methods just described, not all of the surface or surfaces receive uniform cleaning or processing and therefore the results are not uniform, and material removed from the surface of the sheet travels with the sheet. The latter is a definite disadvantage if further processing steps are required. It is therefore an object of the present invention to provide an apparatus which permits a thin sheet of material to pass through the nip of counterrotating brushes without damage. Another object of the present invention is to take full advantage of the known superiority of counterrotating brushes in cleaning or processing sheet materials.

The foregoing objectives are achieved, in accordance with the present invention by utilizing a stationary device which protects the leading edge of a thin plate from the bristles of the counterrotating brushes for a critical distance of its travel into the space between the brushes. This device permits sufficient contact between the surface of the plate and the bristles of the brushes to enable the necessary rubbing and cleaning action to take place. The device, or guide means, is in the form of two parallel guide plates having a smooth opening at the edge where the plate to be processed first enters, and which may terminate in a plurality of spaced, open "fingers". This guide means projects a critical distance into the nip between the two revolving brushes to permit continued passage of the plate therethrough. The guide means is made of plastic or of metal which will not deteriorate, dissolve, or be corroded by the action of developing and processing solutions used. The guide plates, with which the fingers, when employed, form a unitary structure, are smooth on the inner faces in order to prevent scratching of the plates.

For a better understanding of the invention together with other and further objects, advantages and capabilities thereof, reference is made to the drawings wherein.

Figure 1:
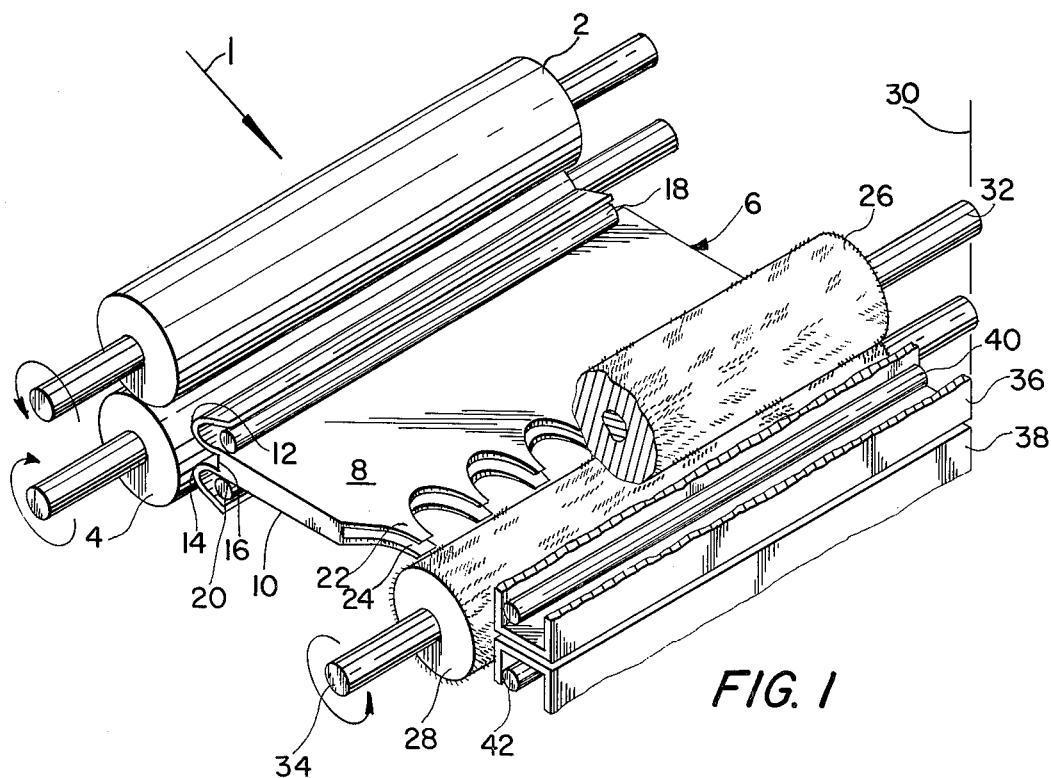
FIG. 1 is a perspective view of a portion of a lithographic developing apparatus for treating both sides of a plate, which schematically shows the guide mechanism of the present invention, its spatial relation to the counterrotating brushes and its function.

In accordance with FIG. 1, the plate to be processed is fed into the apparatus, in the direction of the arrow 1, by means of infeed rollers 2 and 4. From the infeed rollers, the plate passes through the guide assembly 6. Guide assembly 6 comprises an upper guide plate 8 and a lower guide plate 10. The entrance end of guide plates 8 and 10 is preferably rolled outwardly from the plane of the plate, as shown by rolled edges 12 and 14, in order to prevent damage to the plate or jamming of the plate. In passing through the guide assembly 6, the plate traverses the channel 16 formed between plates 8 and 10. This lamellar space or channel between guide plates 8 and 10 is preferably kept flooded with a developing solution, supplied through developer supply conduits 18 and 20, thus, also forming a pre-soak chamber. The pre-soak chamber may be open on the sides or it may be closed as illustrated in FIG. 1. The plate continues to be propelled by the continued rotation of transport rollers 2 and 4 so that it emerges at the exit end of guide plates 8 and 10 between guide fingers 22 and 24, respectively. To the extent necessary, additional developing solution may be introduced by appropriate developer supply conduits (not shown) similar to conduits 18 and 20 and mounted adjacent the exit end of guide plates 8 and 10. It is to be noted that the tips of guide fingers 22 and 24 extend well into the space between counterrotating rotary brushes 26 and 28. However, the tips of guide fingers 22 and 24 terminate just short of the plane 30 passing through the central axes of the rotational axles 32 and 34, respectively, of rollers 26 and 28. This degree of penetration of the guide fingers between the rollers 26 and 28 is sufficient to prevent the bristles of brushes 26 and 28 from repelling the leading edge of the plate, as would be the case in the absence of guide fingers 22 and 24. Axles 32 and 34 of brushes 26 and 28 may be hollow and serve as conduits for the supply of additional developing fluid, which fluid will be forced outwardly through and between the bristles of brushes 26 and 28. Due to the high differential speed between the plate and the bristles of brushes 26 and 28, very effective cleaning is accomplished in this manner. After leaving counterrotating brushes 26 and 28, the plate passes between reciprocatable or oscillatable scrubber pads 36 and 38. Scrubber pads 36 and 38 are also provided with appropriate developer supply conduits 40 and 42, respectively.

Figure 2:
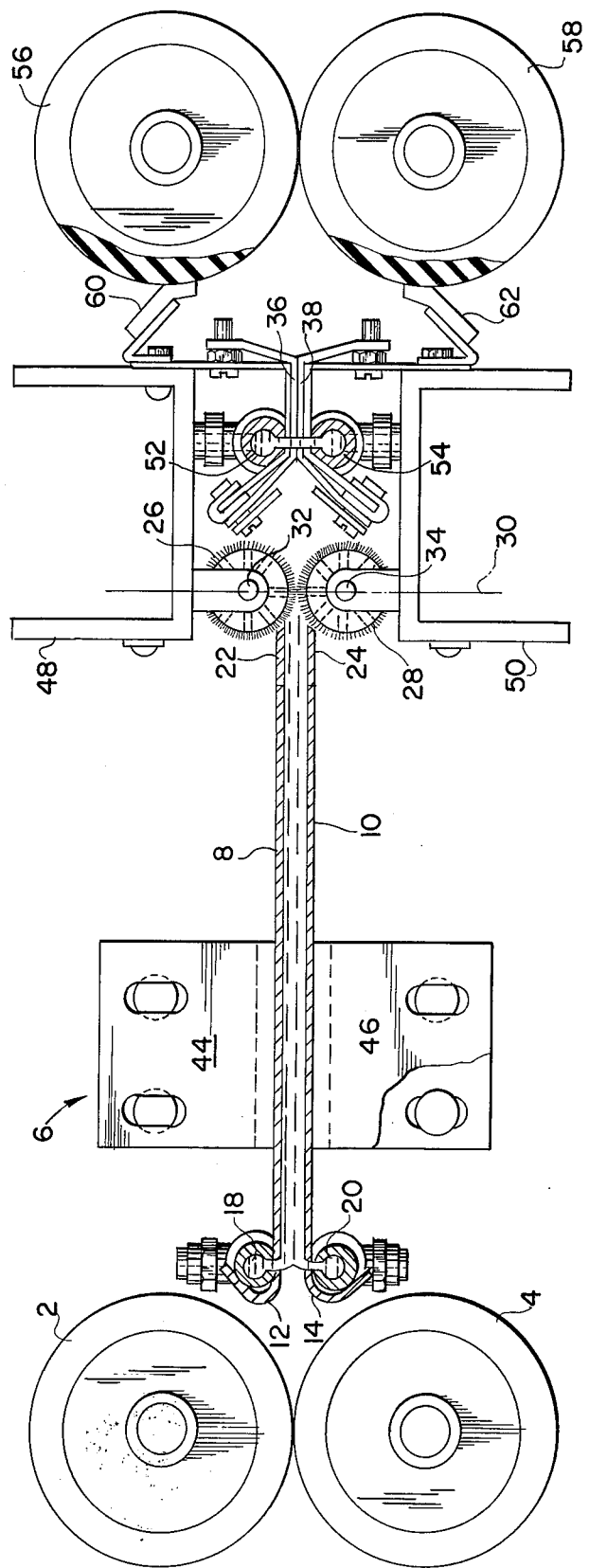
FIG. 2 is a side view, partially in cross-section, of the apparatus of FIG. 1.

Referring now to FIG. 2, as previously indicated, the plate to be processed enters through the feed rollers 2 and 4 and is fed through guide assembly 6. Guide assembly 6 is mounted immediately in front of brushes 26 and 28, with respect to the direction of travel of the plate through the apparatus, and is supported by mounting plates 44 and 46. From the exit end of guide assembly 6, the plate passes between counterrotating brushes 26 and 28. Brushes 26 and 28 are supported by brackets 48 and 50. Brackets 48 and 50 also support scrubber pads 36 and 38 which are adapted to be laterally reciprocated to provide an appropriate scrubbing action. Scrubbing pads 36 and 38, as previously indicated, are supplied with developing fluid through conduits 52 and 54. From the scrubbing pads 36 and 38, the plate passes between squeegee rollers 56 and 58. If any coating particles remain on the surface of the plate, they usually will be attracted to the surface of the squeegee rollers, since these rollers are covered with a material, such as synthetic rubber, which has a greater affinity for the particles of the coating than does the metal of the plate being processed. Particles adhering to squeegee rollers 56 and 58 are removed by the cleaning pads 60 and 62 which are also mounted on brackets 48 and 50.

As is apparent from FIGS. 1 and 2, this apparatus is designed to develop a plate which has been imaged on both sides or a pair of plates, imaged on one side only, arrranged in back-to-back relationship as they pass through the apparatus. Obviously, as is known in the art, after leaving the squeegee rollers 56 and 58 of FIG. 2, the plate is subjected to further treatments, such as rinses, finishes and the like.

Figure 3:
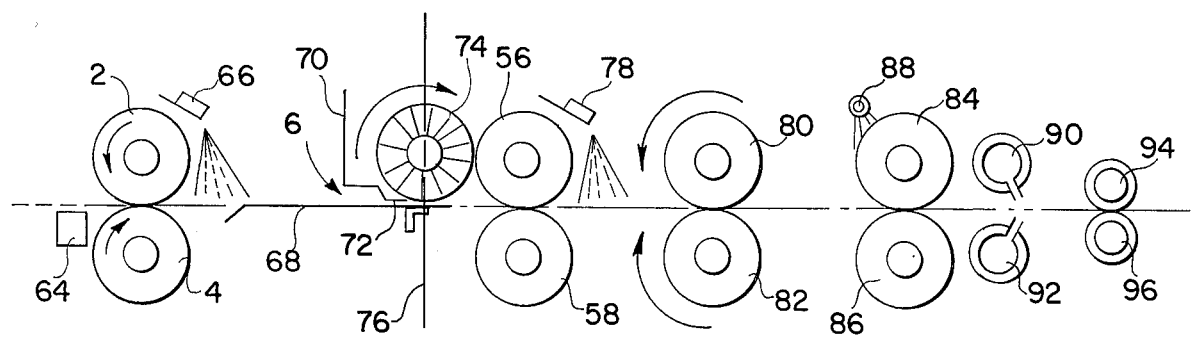
FIG. 3 is a side view of a complete lithographic developing apparatus for treating one side of a plate, which schematically shows the guide mechanism of the present invention with relation to the remainder of the processor.

FIG. 3 of the drawings schematically shows an apparatus suitable for processing a one-sided plate and utilizing a modified form of the guide assembly of the present invention. As in the previous apparatus, the plate is fed in through feed rollers 2 and 4. Prior to entering feed rollers 2 and 4, the plate actuates a proximity switch 64 which starts the processor. Following the feed rollers 2 and 4 are developer dispensing nozzles 66 which spray developing fluid on the top of the single-sided plate. Thereafter, the plate passes through guide assembly 6. In this instance, guide assembly 6 comprises a lower support plate 68 and an upper guide plate 70 provided with guide fingers 72. As in the previous apparatus, the guide fingers extend into the nip of counterrotating brush 74 to a point just short of vertical plane 76 passing through the central axis of counterrotating brush 74. After passing brush 74, the plate may pass through scrubbing pads (not shown), as in the previous apparatus. Thereafter, the plate passes through developer, transport and squeegee rollers 56 and 58. The plate is then sprayed with a rinsing solution by means of rinse dispensing nozzles 78. The plate thereafter passes between rinse-transport-squeegee rollers 80 and 82. From the squeegee rollers 80 and 82, the plate is transported between gum applicator-transport-squeegee rollers 84 and 86. A protective gum is dispensed through gum dispensing tube 88 onto squeegee roller 84 to apply the gum to the face of the plate. From rollers 84 and 86, the plate is transported to air dryers 90 and 92 and finally between exit rollers 94 and 96. It has been found that in a processor of the type illustrated in FIG. 3, it is desirable to angle the upper guide plate 70 of the guide assembly 6, which upper guide plate carries the fingers 72, downward relative to the lower guide plate 68. The lower guide plate is, of course, held horizontally and parallel with the nips of the transport rollers 56 and 58. This narrows the distance between the fingers and adds support to thin materials.

It has been found that guide means composed of a flat plate (for one-sided application) or two flat plates (for two-sided application) serve well to protect lithographic plates from damage by the counterrotating brushes; however, when the guide plates terminate in spaced fingers superior results are obtained due to increased exposure of the lithographic plate to the brush or brushes.

The spacing of fingers 22 and 24 of FIGS. 1 and 2 and the width of the fingers can be widely varied without departing from the spirit of the present invention. Thus, moderately wide fingers, with fairly wide spacing between the fingers, are shown as one embodiment. An alternative would be a plurality of relatively narrow fingers spaced closer together. This configuration is preferred when feeding relatively thin flexible material. The fingers, whether of metal or of plastic, must resist the chemicals of the processing bath. The material of the fingers 22 and 24 of FIGS. 1 and 2 and the guide plate or plates is selected according to known principles of selection of materials of construction. Thus, stainless steels, beryllium copper, monel metal, polymethyl methacrylate, polyacetals, polyvinyl sulfones, nylon, polycarbonates and other plastics known frequently as "engineering" plastics may be used. It is also essential that the material of the guide fingers and plates have sufficient stiffness to withstand the continued pressure of the bristles of the brush during operation.

EXAMPLE I

A negative working plate, Enco N 50, manufactured by the Azoplate Division of American Hoechst Corporation, was exposed through a half-tone negative transparency in a Nu Arc FT 40M for 60 units. The exposed plate was introduced through the feed end of the developing machine, as illustrated in FIGS. 1 and 2. Upon emerging from the nip of the transport rollers, it entered the pre-soak chamber which contains Enco Subtractive Developer, manufactured by Azoplate, a division of American Hoechst Corporation. The plate next entered between the brushes. Following action by oscillating scrubbers, the plate is rinsed, squeegeed, air-dried, and transported through exit rollers. The plate emerged flat and undamaged. The step wedge after development showed that the exposure had been made to a solid 6 on the Stouffer Scale. The plate was carefully examined with a 10× magnifier. The development was clean and all non-image areas were free from coating. All 2% dots were present, indicating that the development process was not excessive. The 97% shadow dots were well defined. Similar experiments made in the absence of any guide means resulted in either the top or bottom brush forcing the metal plate away from the travel path, thus curling the plate and rendering it useless.

EXAMPLE II

A positive Enco P-500, one side-coated plate was processed in a machine illustrated in FIG. 3. The plate was exposed through a half-tone positive transparency in a Nu Arc FT 40M for 60 seconds. The exposed plate was then introduced into the feed rollers and sprayed with Enco developer PD-140, manufactured by Azoplate, a division of American Hoechst Corporation. The sprayed plate next was transported under the finger guides and through the counterrotating brush. After completion of processing, the plate was examined and found to be very satisfactorily developed.

EXAMPLE III

A processing machine for electrostatic printing plates equipped with the transport roller, finger guide and single counterrotating brush features of the plate developing machine of Example II was used in this Example. A charged, exposed, toned, and fuse delectrostatic plate, Elfo, manufactured by Azoplate, a division of American Hoechst Corporation, was introduced in the above-noted machine and treated with an alkaline decoating solution. The action of the finger guides and counterrotating brush, as in the previous example, resulted in a properly decoated plate. Following a desensitization step, the plate was gummed. The plate was then ready for the press.

The guide mechanism of the present invention, in conjuction with counterrotating brushes, can also be used for threading web materials, cleaning individual sheets, graining operations, lithographic printing plates, electrostatic plate developing apparatus, etc.

It will be obvious to those skilled in the art that many modifications may be made within the scope of the present invention without departing from the spirit thereof, and the invention includes all such modifications.

What is claimed is:

1. In apparatus for treating sheet material in which said sheet material is transported into revolving brush means, including a pair of brushes mounted adjacent opposite sides of said sheet material, rotating in a direction opposite to the direction of travel of said sheet material and having a nip, the improvement comprising guide means, including a pair of generally-flat plates having a length substantially equal to the width of said sheet material, mounted adjacent opposite sides of said sheet material and immediately in front of said brushes, with respect to the direction of travel of said sheet material, and extending into the nip of said brushes to a point just in front of a vertical plane through the axes of rotation of said brushes and treating fluid dispensing means operatively connected to said plates to flood the space between said plates and, in conjuction with said plates, form a soaking chamber.

2. Apparatus in accordance with claim 1 wherein the plates terminate in spaced fingers disposed along the length thereof.

3. Apparatus in accordance with claim 2 wherein at least the fingers of the plates extend forwardly into the nip of the brushes.

4. Apparatus in accordance with claim 1 wherein the brush means is adapted to remove unwanted material from the surface of the sheet.

5. Apparatus in accordance with claim 1 wherein the apparatus is a printing plate processor and the treating solution is a developer solution.

6. Apparatus in accordance with claim 5 wherein the apparatus is a lithographic plate processor.

* * * * *